(12) United States Patent
Woo et al.

(10) Patent No.: US 7,813,173 B2
(45) Date of Patent: Oct. 12, 2010

(54) MULTI-LEVEL CELL MEMORY DEVICES AND METHODS USING SEQUENTIAL WRITING OF PAGES TO CELLS SHARING BIT BUFFERS

(75) Inventors: Nam-Yoon Woo, Gyeonggi-do (KR); Jin-Kyu Kim, Seoul (KR); Song-Ho Yoon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 123 days.

(21) Appl. No.: 12/196,717

(22) Filed: Aug. 22, 2008

(65) Prior Publication Data
US 2009/0059662 A1 Mar. 5, 2009

(30) Foreign Application Priority Data
Aug. 24, 2007 (KR) .................... 10-2007-0085686

(51) Int. Cl.
*G11C 11/34* (2006.01)
(52) U.S. Cl. .................... 365/185.03; 365/189.16; 365/189.05
(58) Field of Classification Search ............ 365/185.03, 365/189.16, 189.05
See application file for complete search history.

(56) References Cited

U.S. PATENT DOCUMENTS 7,254,064 B2 8/2007 Kim et al.
7,441,072 B2 * 10/2008 Kunori ...................... 711/103

FOREIGN PATENT DOCUMENTS

| JP | 2005-285191 | 10/2005 |
| KR | 100206696 B1 | 4/1999 |
| KR | 1020050007653 A | 1/2005 |
| KR | 10-2006-0086717 A | 8/2006 |

OTHER PUBLICATIONS

M. Bauer et al., "A Multilevel-Cell 32 Mb Flash Memory", 1995 IEEE International Solid-State Circuits Conference, ISSCC Digest of Technical Papers, 7:TA 7.7, pp. 132-133 (Feb. 1995).

* cited by examiner

*Primary Examiner*—Son Dinh
*Assistant Examiner*—Nam Nguyen
(74) *Attorney, Agent, or Firm*—Myers Bigel Sibley & Sajovec, P.A.

(57) ABSTRACT

An apparatus includes a nonvolatile memory including a plurality of memory cells, each configured to store data having at least two bits and a control circuit configured to write data to a first memory cell connected to a wordline of the nonvolatile memory and to then write data to a second memory cell that is connected to wordline and shares a bit buffer with the first memory cell.

10 Claims, 11 Drawing Sheets

MAXIMUM OF ONE PAGE BACKED UP

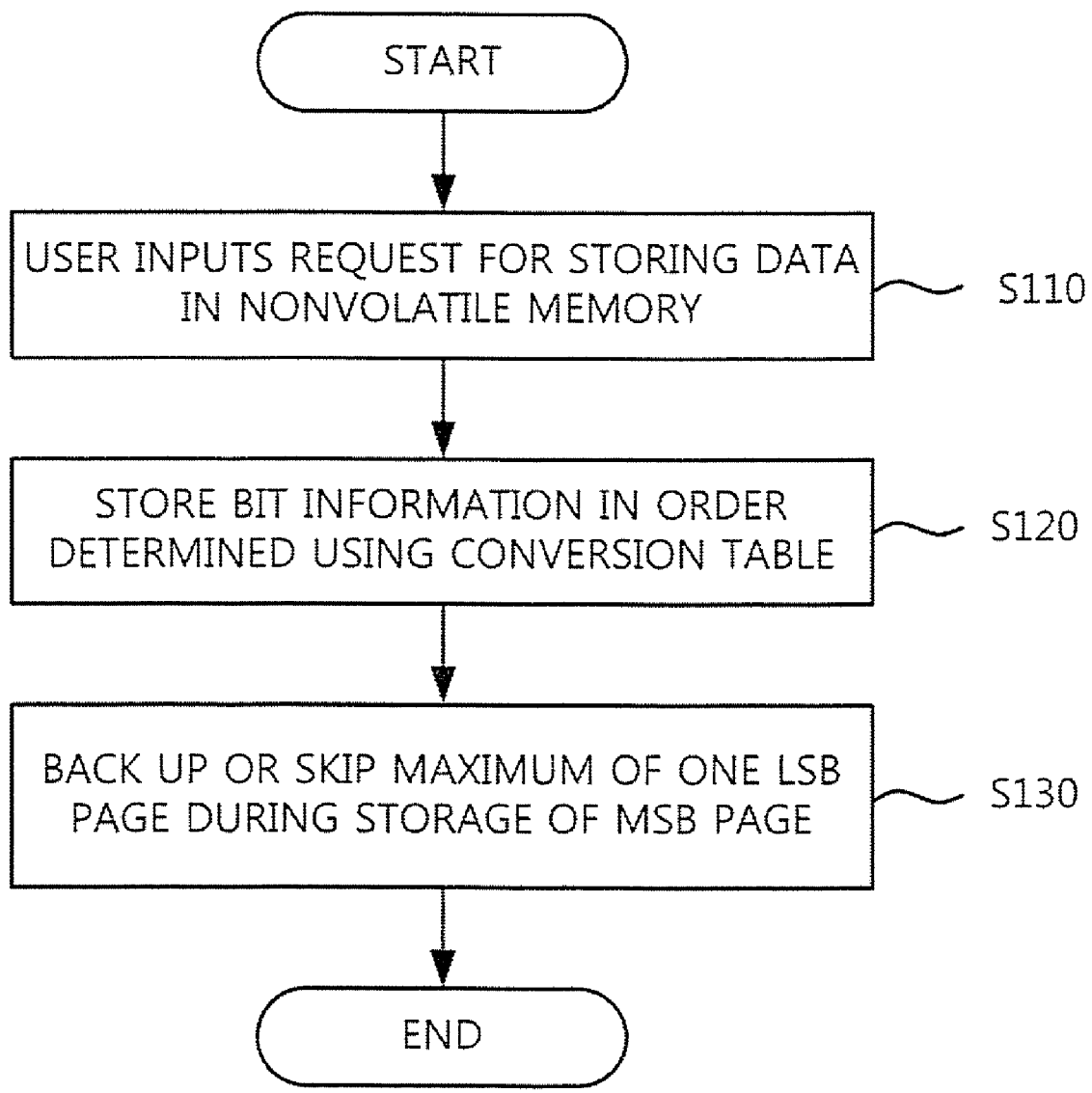

MULTI-LEVEL CELL MEMORY DEVICES AND METHODS USING SEQUENTIAL WRITING OF PAGES TO CELLS SHARING BIT BUFFERS

CROSS-REFERENCE TO RELATED APPLICATION

This application claims priority from Korean Patent Application No. 10-2007-0085686 filed on Aug. 24, 2007 in the Korean Intellectual Property Office, the disclosure of which is incorporated herein by reference in its entirety.

FIELD OF THE INVENTION

The present invention relates to memory devices and operations thereof and, more particularly, to multi-level cell (MLC) memory devices and methods of operation thereof.

BACKGROUND OF THE INVENTION

Nonvolatile memories have been widely used as storage media in various embedded systems, such as home electronic devices, communication devices and set-top boxes. Nonvolatile memories can provide not only the advantages of random access memories (RAMs), which can be freely erased and written to, but also the advantages of read only memories (ROMs), which can store data stored even when a power supply is not present.

In some nonvolatile memories, data bits are stored in memory cells which include a single field-effect transistor having a control gate, a floating gate, a source and a drain. A data bit may be stored in the memory cell by varying the amount of charge at the floating gate so that the threshold voltage of the memory cell can be varied. Data may be read from the memory cell by applying a selection voltage to the control gate of the memory cell via a wordline.

Some memory cells simply have the capacity to store one bit indicating one of two different states, that is, the memory cell stores a bit-value of 1 or a bit value of 0 according to the voltage applied thereto to indicate a state in which data has been erased or a state in which data has been written. A technique for significantly reducing the cost per bit of nonvolatile memories is disclosed in "A Multilevel-Cell 32 Mb Flash Memory," IEEE, ISSCC Digest of Technical Papers, pp. 132-133, M. Bauer et al., February 1995. This technique is characterized by providing the capacity to store two bits in each memory cell to indicate one of four different states.

Nonvolatile memories having the capacity to store two bits in each memory cell to indicate one of four different states are often referred to as multi-level cell (MLC) nonvolatile memories. Some MLC nonvolatile memories can store bit information regarding two pages in a memory cell, where the two pages are respectively referred to as a least significant bit (LSB) page and a most significant bit (MSB) page. Bit information is stored in the LSB page and then in the MSB page. For example, a 2-level MLC flash memory may represent four states, i.e., 00, 01, 10, and 11, using two bits.

An MLC nonvolatile memory may include a plurality of bit strings, each having a plurality of memory cells connected in series. A wordline may be connected to a plurality of memory cells that belong to different bit strings and that have the same offset.

In such an MLC nonvolatile memory, a pair of bit strings may share one bit buffer. In this case, bit information may be stored in an LSB page of a memory cell of one of the pair of bit strings, and then stored in an LSB page of a memory cell of the other bit string. Thereafter, the bit information may be alternately stored in the MSB pages of the memory cells of the pair of bit strings.

If power is cut off or a system error occurs while storing bit information in an MSB page of an MLC nonvolatile memory, the bit information stored in the MSB page may be corrupted, which may also corrupt bit information stored in an LSB page. In order to prevent corruption of the bit information stored in the LSB page, the bit information of the LSB page may be backed up or skipped.

More specifically, referring to FIG. 1, in order to avoid corruption of page E, which is an LSB page, during the storage of page X, which is an MSB page, page E may be backed up. In some conventional memory device, however, two pages may actually need to be backed up, as illustrated in FIG. 2. Referring to FIG. 3, in order to prevent corruption of page E during the storage of page X, page E may be skipped. In some conventional devices, however, two pages may actually be skipped, as illustrated in FIG. 4.

An LSB page may be backed up or skipped in order to prevent the bit information stored in the LSB page from being corrupted by the bit information not correlated with the bit information stored in the LSB page. For example, referring to FIG. 1, even though pages A, B, C, D, and E correlate with each other and page X does not correlate with any one of pages A, B, C, D, and E, the bit information stored in page E may be corrupted while storing bit information in page X. However, if two pages may be skipped or backed up at a time, this may cause a waste of storage capacity and may decrease the efficiency of the use of storage capacity.

Korean Patent Laid-Open Gazette No. 2005-007631 describes an MLC flash memory and a method of reading data from the MLC flash memory, in which data is read from an LSB page twice and then data is read from an MSB page once. However, this technique may not overcome decreased efficiency in the use of storage capacity in nonvolatile memories.

SUMMARY OF THE INVENTION

In some embodiments of the present invention, an apparatus includes a nonvolatile memory including a plurality of memory cells, each configured to store data having at least two bits, a wordline connected to first and second memory cells of the plurality of memory cells and a bit buffer shared by the first and second memory cells. The apparatus further includes a control circuit configured to write data to the first memory cell and to then write data to the second memory cell. The first memory cell may be one of a first string of series-connected memory cells and the second memory cells may be one of a second string of series-connected memory cells that shares the bit buffer with the first string of series-connected memory cells. The control circuit may be configured to write bit information of an LSB page and the bit information of an MSB page to the first memory cell and to then write bit information of an LSB page and bit information of an MSB page to the second memory cell. The control circuit may be configured to write data to the plurality of memory cells in an order of wordline offset.

Further embodiments of the present invention provide methods of operating a nonvolatile memory device including a plurality memory cells each configured to store information of at least two bits length. Data is written to a first memory cell connected to a wordline and then data is written to a second memory cell that is connected to the wordline and that shares a bit buffer with the first memory cell. The first memory cell may be one of a first string series-connected memory cells and the second memory cell may be one of a second string of series-connected memory cells that shares the bit buffer with the first string of series-connected memory cells. Writing data to a first memory cell connected to a wordline may include writing an LSB page bit and an MSB page bit to the first memory cell and writing data to a second memory cell that is connected to the wordline and that shares a bit buffer with the first memory cell may include writing an LSB page bit and an MSB page bit to the second memory cell. The methods may further include writing data to the plurality of memory cells in an order of wordline offset.

Some embodiments of the present invention provide apparatus and methods in which bit information is stored in a plurality of pages of a multi-level cell (MLC) nonvolatile memory in such an order that the storage space required to reduce that likelihood that a least significant bit (LSB) page may be corrupted by a corrupted most significant bit (MSB) page that shares a memory cell with the LSB page.

According to some embodiments of the present invention, there is provided a data processing apparatus including: a nonvolatile memory which includes a plurality of memory cells storing data of at least 2 bits long; and a control circuit which writes data on a first memory cell in a predetermined wordline of the nonvolatile memory and then data on a second memory cell that shares a bit buffer with the first memory cell. According to further embodiments of the present invention, there is provided a data processing method of a nonvolatile memory, the method including: writing data on a first memory cell in a predetermined wordline of the nonvolatile memory which includes a plurality of memory cells storing data of at least 2 bits long; and writing data on a second memory cell that shares a bit buffer with the first memory cell.

BRIEF DESCRIPTION OF THE DRAWINGS

The above and other aspects and features of the present invention will become more apparent by describing in detail embodiments thereof with reference to the attached drawings, in which:

FIG. 11 is a flowchart illustrating data processing operations of a nonvolatile memory according to some embodiments of the present invention.

DETAILED DESCRIPTION OF EMBODIMENTS

Figure 1:
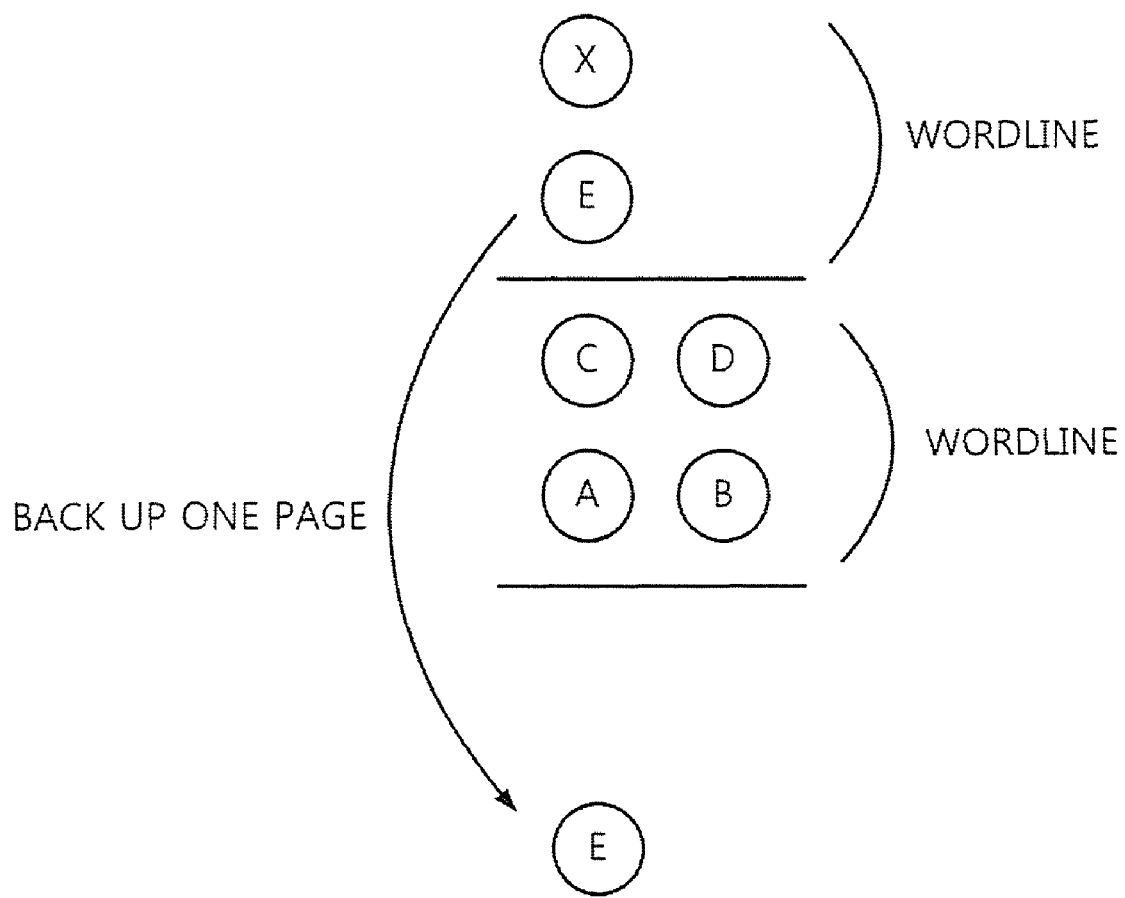
FIGS. 1 and 2 are diagrams illustrating a conventional method of storing bit information by backing up a least significant bit (LSB) page of a multi-level cell (MLC) nonvolatile memory.
Figure 2:
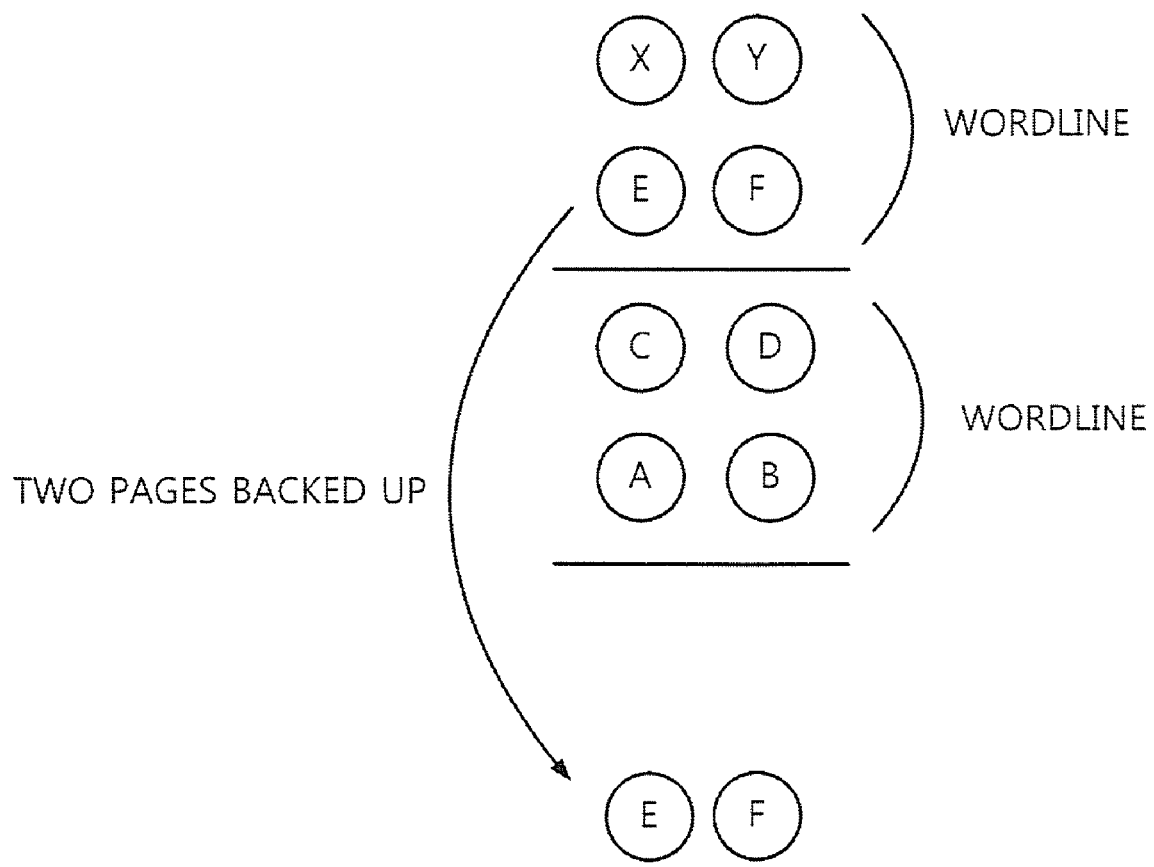
Figure 3:
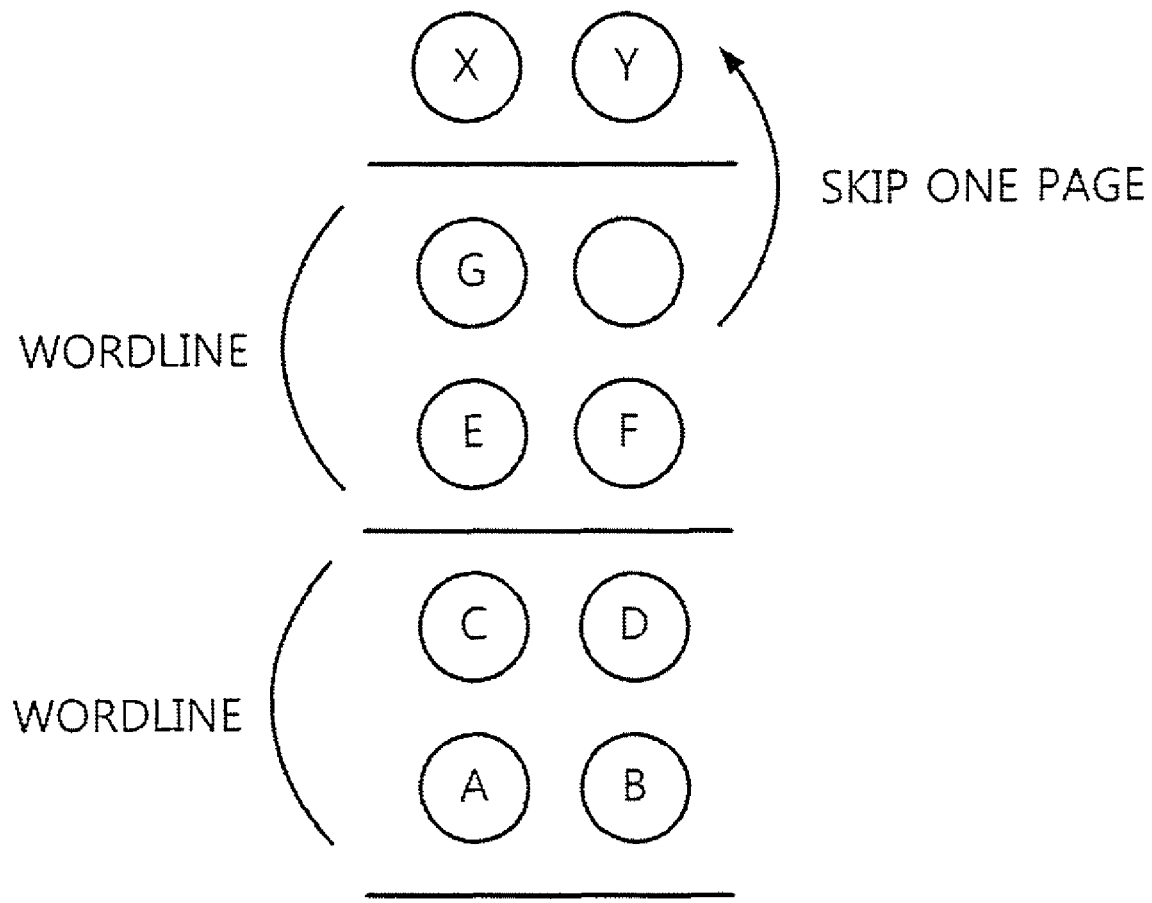
FIGS. 3 and 4 illustrate diagrams illustrating a conventional method of storing bit information by skipping an LSB page of an MLC nonvolatile memory.
Figure 4:
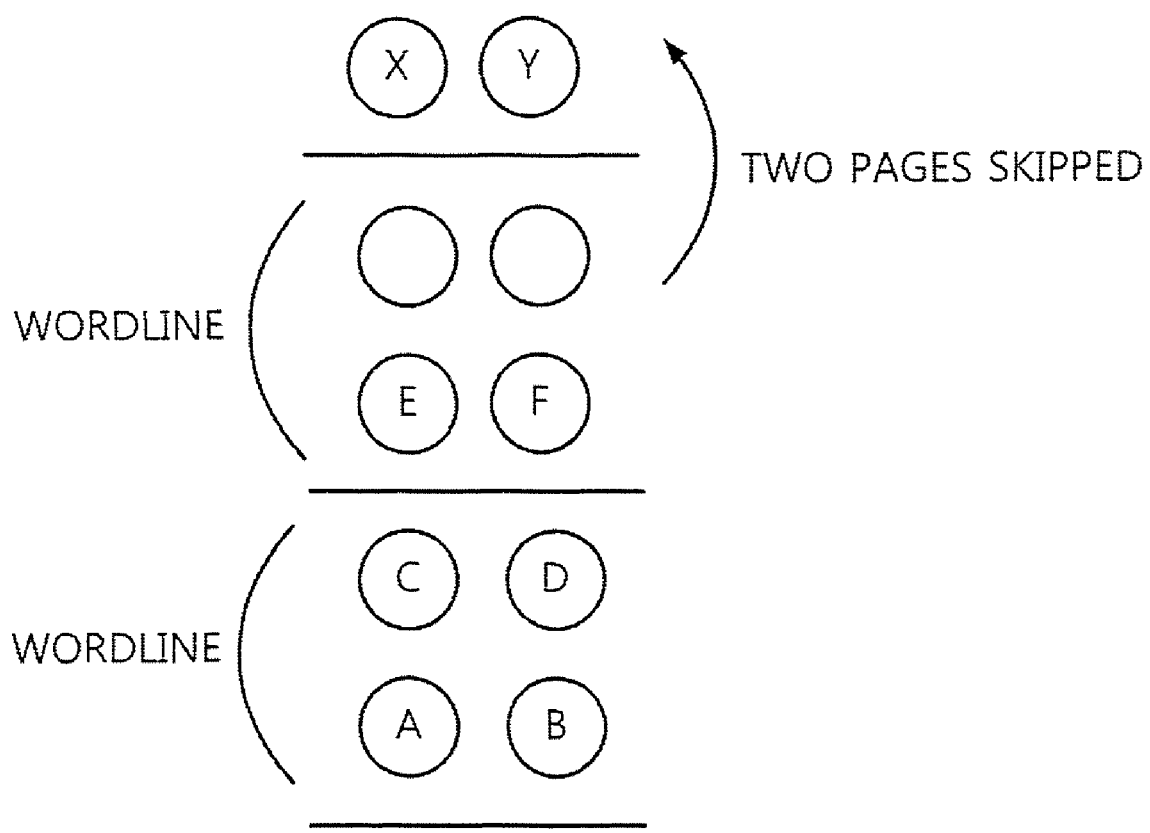

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element is referred to as being "connected to" or "coupled to" another element, it may be directly connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, third etc. may be used herein to describe various elements, components and/or sections, these elements, components and/or sections should not be limited by these terms. These terms are only used to distinguish one element, component, or section from another element, region or section. Thus, a first element, component or section discussed below could be termed a second element, component or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification, and will not be interpreted in an idealized or overly formal sense unless expressly so defined herein.

The term 'circuit', as used herein, means, but is not limited to, a software or hardware component, such as a Field Programmable Gate-Array (FPGA) or Application-Specific Integrated Circuit (ASIC), which performs certain tasks. A circuit may advantageously be configured to reside on the addressable storage medium and configured to execute on one or more processors. Thus, a circuit may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and circuits may be combined into fewer components and circuits or further separated into additional components and circuits.

Figure 5:
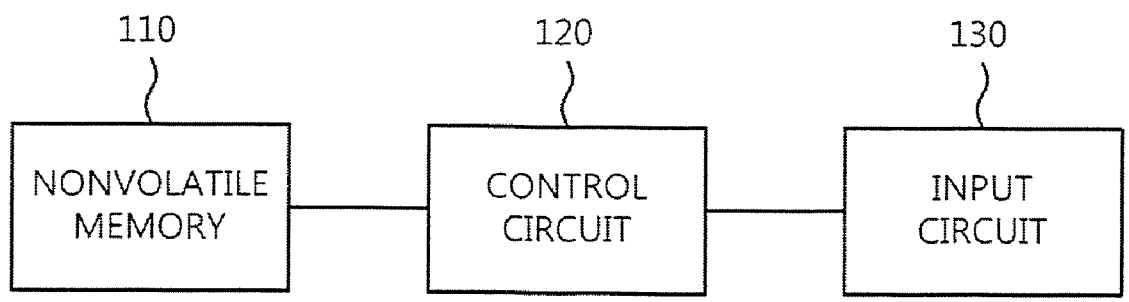
FIG. 5 is a block diagram of an apparatus according to some embodiments of the present invention.

FIG. 5 is a block diagram of an apparatus 100 according to some embodiments of the present invention. Referring to FIG. 5, the data processing apparatus 100 includes a nonvolatile memory 110, a control circuit 120, and an input circuit 130. In the embodiments of FIG. 5, the nonvolatile memory 110 may be a multi-level cell (MLC) nonvolatile memory, such as an MLC NAND flash memory which is capable of storing data of at least 2 bits long in one memory cell.

Bit information of two or more pages can be stored in each memory cell of the nonvolatile memory 110. For example, if 2-bit data is stored in a memory cell of an MLC NAND flash memory, a number of pages corresponding to the memory cell may be interpreted as being bound together, and the memory cell may store bit information of a least significant bit (LSB) page and a most significant bit (MSB) page that belong to the same block and are bound together. The LSB page and the MSB page may be adjacent to each other or may be spaced apart from each other. Bit information of 2 bits length that can represent one of four different states is stored in a memory cell, but the present invention is not restricted to this, i.e., bit information of 2 or more bits long may be stored in a memory cell.

Figure 6:
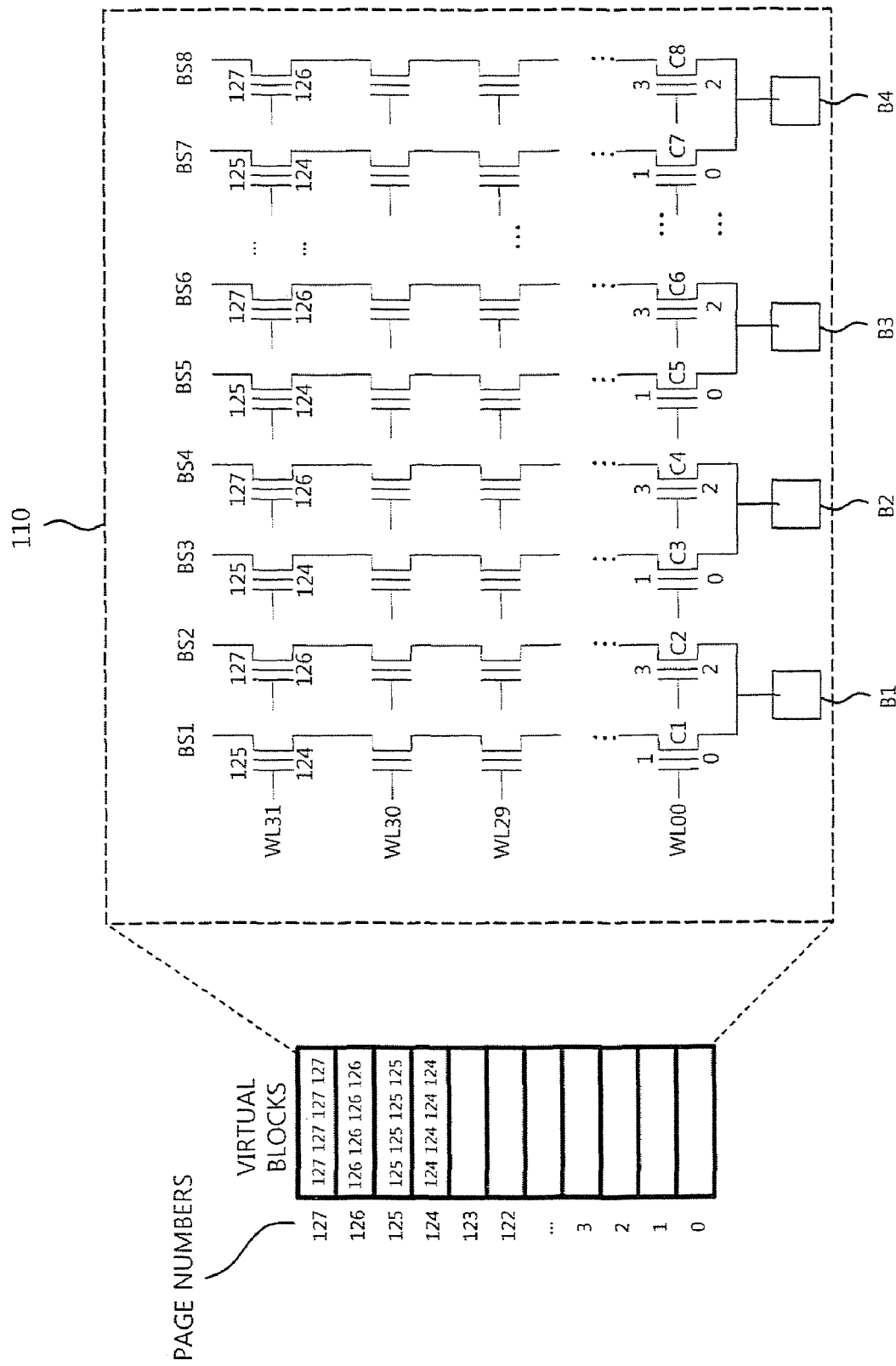
FIG. 6 is a diagram of an MLC nonvolatile memory according to some embodiments of the present invention.

FIG. 6 illustrates a structure of the nonvolatile memory 110 according to some embodiments of the present invention. Referring to FIG. 6, the nonvolatile memory 110 may include 2x bit strings (e.g. eight bit strings BS1-BS8), x bit buffers (e.g. four bit buffers B1-B4), and a plurality of wordlines WL00-WL31. A plurality of memory cells are connected in series in each of the bit strings BS1-BS8. The first bit buffer B1 is shared by the first and second bit strings BS1 and BS2, the second bit buffer B2 is shared by the third and fourth bit strings BS3 and BS4, the third bit buffer B3 is shared by the fifth and sixth bit strings BS5 and BS6, and the fourth bit buffer B4 is shared by the seventh and eighth bit strings BS7 and BS8. Each of the wordlines WL00-WL31 is connected to a plurality of memory cells, each having the same offset, e.g., cells C1-C8 are connected to the wordline WL00. The memory cells C1-C8 also belong to respective ones of the bit strings BS1-BS8. The structure of the nonvolatile memory 110 will hereinafter be described in further detail, focusing mainly on the first and second bit strings BS1 and BS2, the wordline WL00, the first and second memory cells C1 and C2 connected to the wordline WL00.

Still referring to FIG. 6, the nonvolatile memory 110 includes a total of 32 wordlines (i.e., the wordlines WL00-WL31), and the memory cells connected to each of the 32 wordlines may store bit information of four pages. For example, for pages 0-3, a first memory cell C1 may store bit information of page 0 and page 1, and a second memory cell C2 may store bit information of page 2 and page 3. One physical block of the nonvolatile memory 110 may include a total of 128 pages.

In order to preserve validity of bit information, the nonvolatile memory 110 may store bit information for the wordlines WL00-WL31 in ascending order of the wordline numbers of the wordlines WL00-WL31. For example, if bit information is previously stored in an x-th wordline, the bit information may be stored this time in a wordline designated with a wordline number greater than x, which may minimize interference between memory cells and help ensure the validity of the bit information. The order in which bit information is stored in a plurality of memory cells belonging to the same wordline may be arbitrarily determined.

The control circuit 120 stores bit information in the nonvolatile memory 110 in the order of the wordline numbers of the wordlines WL00-WL31. More specifically, the control circuit 120 may store bit information in such an order that the number of pages that need to be skipped or backed up in order to ensure the validity of bit information of an LSB page in the case when an error occurs during the storage of bit information in an MSB page that shares a memory cell with the LSB page can be reduced.

Figure 7:
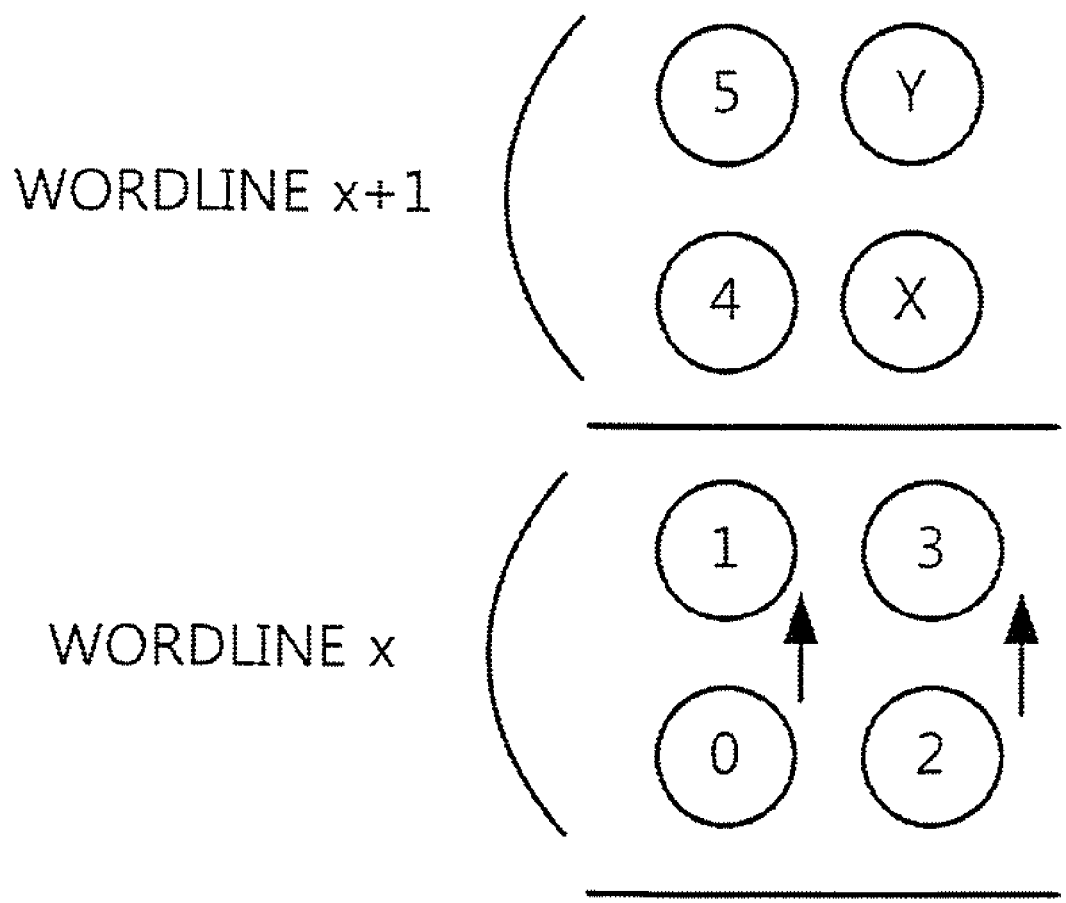
FIG. 7 is a diagram illustrating operations for storing bit information of a plurality of pages in an MLC nonvolatile memory according to some embodiments of the present invention.

FIG. 7 illustrates an order in which bit information may be stored in a plurality of pages. Referring to FIG. 7, pages 1, 2, 3, 4 and 5 are correlated and pages X and Y are not correlated with pages 1, 2, 3, 4 and 5. A total of 4 pages are stored in one wordline. Arrows indicate the order in which bit information is stored.

Still referring to FIG. 7 in conjunction with FIG. 5, the control circuit 120 may store bit information of an LSB page and bit information of an MSB page in one of a pair of memory cells that belong to respective ones of a pair of bit strings sharing the same bit buffer, and then may store the bit information of the LSB page and the bit information of the MSB page in the other memory cell, instead of alternately storing bit information in a pair of bit strings that share a bit buffer.

Figure 8:
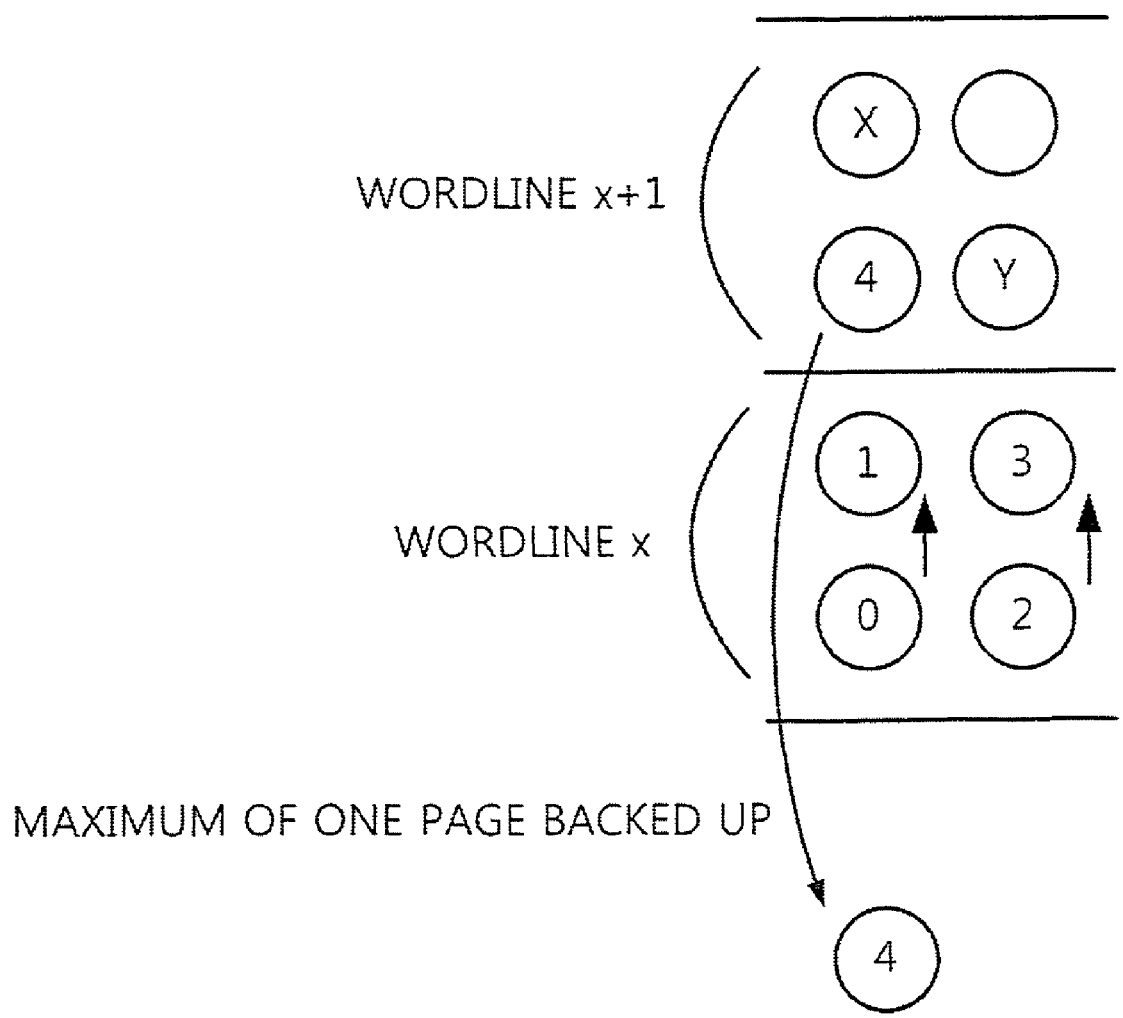
FIG. 8 is a diagram illustrating operations for storing bit information by backing up an LSB page of an MLC nonvolatile memory according to some embodiments of the present invention.
Figure 9:
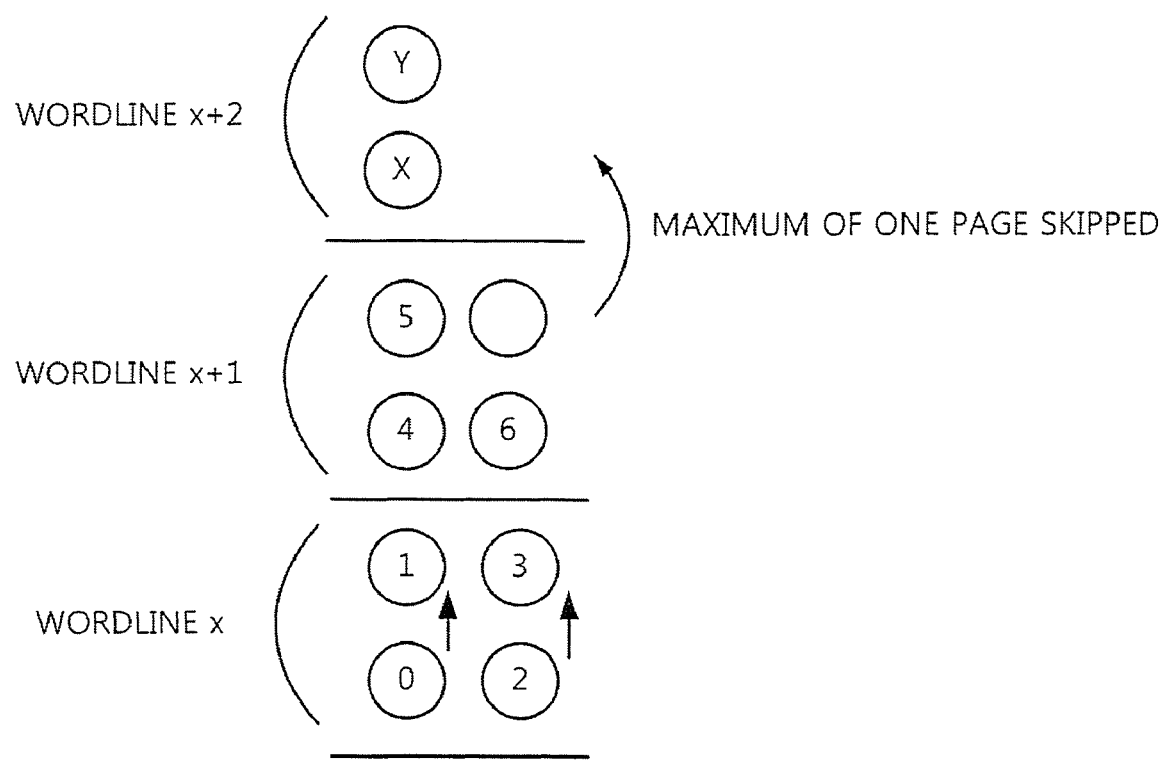
FIG. 9 is a diagram illustrating operations for storing bit information by skipping an LSB page of an MLC nonvolatile memory according to some embodiments of the present invention.

Referring to FIG. 8, if there is a need to back up bit information of an LSB page after storing the bit information of the LSB page and then bit information of an MSB page that shares a memory cell with the LSB page in order to ensure the validity of the bit information of the LSB page, only one page need be backed up, which can reduce the storage space required to ensure the validity of the bit information of the LSB page. Referring to FIG. 9, if there is a need to skip bit information of an MSB page after storing bit information of an LSB page that shares a memory cell with the MSB page in order to ensure the validity of the bit information of the LSB page, only one page need be skipped, which can reduce the use of storage space.

Therefore, in the embodiments of FIGS. 7-9, only one page need be backed up or skipped, whereas in the prior art, two pages may need to be backed up or skipped. Thus, according to the embodiments of FIGS. 7-9, it is possible to reduce the storage space required to ensure the validity of an LSB page and reduce the waste of storage capacity.

The order in which the control circuit 120 stores bit information in a plurality of pages may be effectively applied to the storage of data that is not correlated with each other. Referring to FIG. 9, if pages 0, 1, 2, 3, 4, 5, and 6 are stored and then page X that is not correlated with pages 0, 1, 2, 3, 4, 5 and 6, is stored, bit information of page 6 may become erroneous. However, according to the embodiments of FIGS. 7-9, it is possible to prevent errors from occurring while storing a number of pages that do not correlate with each other.

FIGS. 7-9 illustrate particular numbers of pages, but the present invention is not restricted thereto. Referring to FIGS. 7-9, pages indicated by reference numerals 0-6 are different from pages indicated by reference characters X and Y, pages indicated by reference numerals 0-6 are correlated with each other, and pages indicated by reference characters X and Y are correlated with each other.

Figure 10:
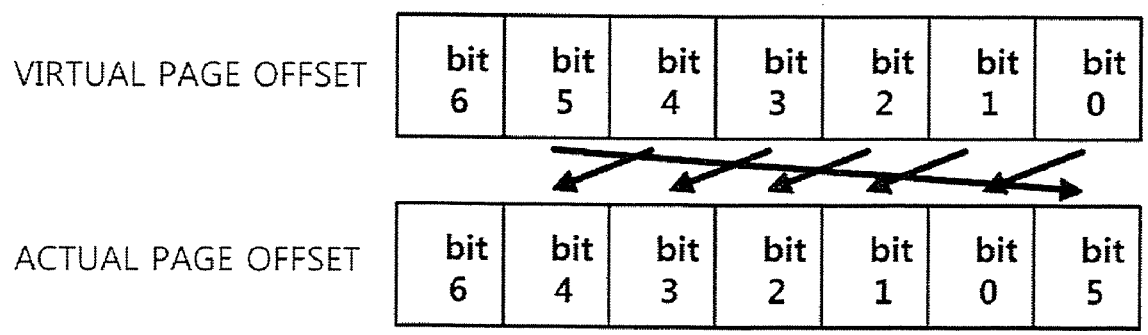
FIG. 10 illustrates a conversion table according to some embodiments of the present invention.

If it is desired to store bit information of pages 0-6 using the input circuit 130, the control circuit 120 may store the bit information of pages 0-6 using a conversion table illustrated in FIG. 10 in such an order that an LSB page and an MSB page can both be stored in a memory cell of a first bit string and then can be stored in a memory cell of a second bit string that shares one bit buffer with the first bit string, instead of sequentially storing bit information of pages 0-6.

Referring to FIG. 10, the conversion table includes a virtual page offset field and an actual page offset field. The control circuit 120 may change the order in which the bit information of pages 0-6 is stored using the conversion table illustrated in FIG. 10.

The conversion table illustrated in FIG. 10 may be varied according to whether to alternately store bit information in two memory cells connected to the same wordline or in two memory cells connect to different wordlines.

Tables 1 and 2 are examples of the conversion table illustrated in FIG. 10. More specifically, Table 1 is a conversion table for alternately storing bit information in two memory cells from the same wordline, and Table 2 is a conversion table for alternately storing bit information in two memory cells from different wordlines.

TABLE 1

| Virtual Page Offset | | Actual Page Offset | |
|---|---|---|---|
| Decimal | Binary | Binary | Decimal |
| ... | ... | ... | ... |
| 10 | 00010 10 | 00010 01 | 11 |
| 9 | 00010 01 | 00010 10 | 10 |
| 8 | 00010 00 | 00010 00 | 8 |
| 7 | 00001 11 | 00001 11 | 7 |
| 6 | 00001 10 | 00001 01 | 5 |
| 5 | 00001 01 | 00000 10 | 6 |
| 4 | 00001 00 | 00001 00 | 4 |
| 3 | 00000 11 | 00000 11 | 3 |
| 2 | 00000 10 | 00000 01 | 1 |
| 1 | 00000 01 | 00000 10 | 2 |
| 0 | 00000 00 | 00000 00 | 0 |

TABLE 2

| Virtual Page Offset | | Actual Page Offset | |
|---|---|---|---|
| Decimal | Binary | Binary | Decimal |
| ... | ... | ... | ... |
| 10 | 0001010 | 0001100 | 12 |
| 9 | 0001001 | 0001010 | 10 |
| 8 | 0001000 | 0001000 | 8 |
| 7 | 0000111 | 0000111 | 7 |
| 6 | 0000110 | 0000101 | 5 |
| 5 | 0000101 | 0000011 | 3 |
| 4 | 0000100 | 0000001 | 1 |
| 3 | 0000011 | 0000110 | 6 |
| 2 | 0000010 | 0000100 | 4 |
| 1 | 0000001 | 0000010 | 2 |
| 0 | 0000000 | 0000000 | 0 |

In the exemplary embodiments of FIGS. 7-9, a physical block of the nonvolatile memory 110 of the apparatus 100 includes a total of 128 pages. However, the present invention is not restricted to this, as embodiments of the present invention can be applied to various types of MLC flash memories.

FIG. 11 is a flowchart illustrating data processing operations for a nonvolatile memory according to some embodiments of the present invention. Referring to FIG. 11 in conjunction with FIGS. 5 and 6, a request for storing data is relayed to the apparatus 100 via the input circuit 130 (S110). A physical block of the nonvolatile memory in which the predetermined data is to be stored is allocated to the control circuit 120 based on the request, and the control circuit 120 stores bit information on a plurality of pages in the allocated physical block in an order determined using a conversion table along the lines of Table 1 or Table 2 (S120).

For example, the control circuit 120 may store bit information of an LSB page and bit information of an MSB page in the first memory cell C1 of the first bit string BS1 and then store the LSB page bit information and the MSB page bit information in the second memory cell C2 of the second bit string BS2, which shares the bit buffer B1 with the first bit string BS1.

In the embodiments of FIG. 11, LSB page bit information and MSB page bit information may be stored in the first memory cell C1 of the first bit string BS1 and then stored in the second memory cell C2 of the second bit string BS2 that shares the bit buffer B1 with the first bit string BS1. In this manner, if the MSB page bit information is corrupted, it is possible to back up or skip the LSB page bit information while reducing the use of storage space.

Referring to FIG. 11, if an unexpected event, such as a sudden power cutoff or a system error, occurs while storing bit information of an MSB page in a given memory cell (i.e., during operation S120), the control circuit 120 may back up or skip one LSB page in order to prevent corruption of an LSB page that is bound to the MSB page and that shares a memory cell with the MSB page. That is, in order to prevent an LSB page from being corrupted by data that does not correlates to the LSB page, the control circuit 120 may back up or skip one LSB page.

In short, in the embodiments of FIG. 11, the order in which bit information is stored in a plurality of pages may be changed without requiring hardware modifications. Thus, it is possible to reduce the storage space required to ensure the validity of an LSB page while storing bit information in the order of wordline offset. Therefore, it is possible to improve the efficiency of storage capacity in the nonvolatile memory 110 without major modification of device operation.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus comprising:
a nonvolatile memory comprising a plurality of memory cells, each configured to store data having at least two bits, the plurality of memory cells comprising a first memory cell of a first string of series-connected memory cells and a second memory cell of a second string of series-connected memory cells that shares a wordline and a bit buffer with the first string of memory cells; and
a control circuit configured to write all bit pages of data to the first memory cell and to then write bit pages of data to the second memory cell.

2. The apparatus of claim 1, wherein each of the memory cells stores 2-bit information.

3. The apparatus of claim 1, wherein the control circuit is configured to write bit information of an LSB page and the bit information of an MSB page to the first memory cell and to then write bit information of an LSB page and bit information of an MSB page to the second memory cell.

4. The apparatus of claim 1, wherein the control circuit is configured to write data to the plurality of memory cells in an order of offset of wordlines.

5. The apparatus of claim 1, wherein the first and second memory cells share a first wordline and wherein the control circuit is configured to write all bit pages of data to the first memory cell and to then write bit pages of data to the second memory cell before writing data to a memory cell connected to a second wordline.

6. A method of operating a nonvolatile memory device comprising a plurality memory cells each configured to store information of at least two bits length, the plurality of memory cells comprising a first memory cell of a first string of series-connected memory cells and a second memory cell of a second string of series-connected memory cells that shares a wordline and a bit buffer with the first string of memory cells, the method comprising:

writing all bit pages of data to the first memory cell; and then writing bit pages of data to the second memory cell.

7. The method of claim 6, wherein the memory cells are configured to store 2-bit information.

8. The method of claim 6:

wherein writing all bit pages of data to the first memory cell comprises writing an LSB page bit and an MSB page bit to the first memory cell; and wherein writing bit pages of data to the second memory cell comprises writing an LSB page bit and an MSB page bit to the second memory cell.

9. The method of claim 6, further comprising writing data to the plurality of memory cells in an order of wordline offset.

10. The method of claim 6, wherein the first and second memory cells share a first wordline, wherein writing bit pages of data to the second memory cell comprises writing bit pages of data to the second memory cell before writing data to a memory cell connected to a second wordline.

* * * * *